United States Patent [19]
Grozdanovski et al.

[11] Patent Number: 5,910,282
[45] Date of Patent: Jun. 8, 1999

[54] METHOD FOR MAKING A MULTILEVEL POLYIMIDE STENCIL

[76] Inventors: Dejan Grozdanovski, 177 Sheldon Avenue, Etobicoke, Ontario, Canada, M8W 5L5; Keith C. Carroll, 6 Berney Drive, Caledon East, Ontario, Canada, L0N 1E0

[21] Appl. No.: 08/771,680

[22] Filed: Dec. 23, 1996

[30] Foreign Application Priority Data

Oct. 31, 1996 [CA] Canada ................... 2189291

[51] Int. Cl.⁶ .................... B23K 26/14; B23K 26/16
[52] U.S. Cl. .............. 264/400; 219/121.69; 264/482
[58] Field of Search ........................ 264/400, 482; 219/121.66, 121.68, 121.69

[56] References Cited

U.S. PATENT DOCUMENTS

| | | | |
|---|---|---|---|
| 3,594,261 | 7/1971 | Broerman | 264/400 |
| 3,742,182 | 6/1973 | Saunders | 264/400 |
| 4,851,061 | 7/1989 | Sorkoram | 264/400 |
| 5,087,396 | 2/1992 | Zablotny et al. | 264/400 |

OTHER PUBLICATIONS

"Accelerated Chemical Etching of Kapton® Polyimide Film" by Kreuz et al Presented at IPC 25TH Annual Meeting Apr., 1982 (6 Pages Enclosed).

*Primary Examiner*—Mathieu D. Vargot

[57] ABSTRACT

A method of using a laser to cut a groove or pocket of predetermined depth of less than about 0.005 inches in a stencil comprising a polyimide sheet having a thickness in the range of 0.005 to 0.012 inches including the steps of mounting the stencil on a movable work table and positioning and maintaining a laser a predefined distance from the polyimide sheet above the work table. A laser beam is directed against the polyimide sheet to cut an indentation into said polyimide sheet. The laser beam has a pulse duration and a power level to make the cut into the polyimide sheet. The method further includes the step of directing a gas against the polymide sheet where the laser beam cuts into said polyimide sheet. The gas is pressurized. The depth of the indentation cut into the polyimide sheet by the laser is determined by choosing the pressure of the gas relative to choosing the pulse duration and the power level of the laser beam. The work table is moved relative to the laser whereby the indentation cut into the polyimide sheet creates a groove or pocket as the laser beam moves across the polyimide sheet. By controlling the pressure of the gas normally used to remove dross from the cut edges of the material, the cutting process can be better controlled so that laser milling of polyimide sheet is reliably obtained.

28 Claims, 8 Drawing Sheets

METHOD FOR MAKING A MULTILEVEL POLYIMIDE STENCIL

BACKGROUND OF THE INVENTION

1. Technical Field of the Invention

The present invention relates to a method for using a laser to cut an indentation into a polyimide film. In particular is relates to a method of using a laser to form pockets in polyimide stencils used in the application of solder paste for surface mount electronic assemblies.

2. Description Of Related Art

Surface mount technology is used to mount electronic components on the surface of printed circuit boards or substrates by soldering the components to one or both sides of a substrate. The first step in mounting surface mount components to a surface board is to screen print with a stencil solder paste on the board where the surface mount components are to be positioned.

In the manufacture of stencils, surface mount land patterns referred to as footprints or pads are cut from a stencil to define the sites at which components are to be soldered to a printed circuit board. It should be understood that the design of the land patterns is critical because it not only determines the solder joint strength but it also influences the areas of solder defects cleanability, testability and repair/rework. The accuracy with which the land patterns are cut out from the stencils used in the assembly of printed circuits has a direct bearing on the quality of the finalized product. It is important that the solder paste align with the location of the solder pad and it is necessary that the aperture or land patterns cut out from the stencil be accurate. The accuracy in combination with the minute size of the components used in surface mount techniques results in very small tolerances for error (in the order of 0.0005 inches). The size of the openings cut into the stencil may be in the order of 0.01 inches in size or less.

Chemical etching processes are commonly used to cut out the apertures to form the land patterns in the stencils. While etching processes are well known in the art, they typically involve placing a chemical resistive material over the metal stencil which has openings where the platforms or lands are to be located. Then an etching process etches out openings where the lands are located. Thereafter, the protective layer of plastic on the metal is removed from the metal stencil.

Newer procedures have been developed to cut out land patterns in metal stencils using YAG lasers. These procedures are highly accurate and relatively expensive when one considers that the cost of purchasing a YAG laser is currently in the order of $100,000 to $200,000. Further, the operating costs of YAG lasers are relatively expensive. The YAG lasers typically have a beam focal path of sufficient power to cut through stainless steel stencils having a thickness of 0.005 to 0.012 inches. Consequently, it is important that the edges cut through the metal stencil remain constant. YAG lasers have proven useful in this application.

Recently, a polyimide stencil has been introduced to the market that can be manufactured with a more cost effective low power $CO_2$ laser as well the more expensive YAG laser. This polyimide stencil sold under the trade mark KEPOCH is described in detail in corresponding Canadian Patent application Serial No. 2,181,207 filed Jul. 15, 1996 by Keith C. Carroll and entitled "Polyimide Stencil for use in Electronic Assemblies and Method of Making Same". The polyimide stencil described in this patent application is for a single level stencil.

While the use of lasers is now known for cutting both polyimide film and stainless steel stencils, it should be understood that the lasers are employed to cleanly cut through the stencil and form the openings in the stencils. To facilitate the laser cut, it is known to direct a gas under high pressure at the point where the cut is to be made. The gas, commonly compressed air, is chosen to be at a sufficiently high pressure to blow away any dross formation along the edges of the stencil with the apertures are cut.

Metal stencils have been manufactured with multilevels of stencil thickness in addition to the through openings to accommodate selective printing which allows varying depths of solder paste to be deposited on the circuit board. Multilevel etching of a metal stencil is typically accomplished by chemical milling to first etch a large area, referred to in the industry as a "pocket", to a desired thickness for the components that require lower paste thickness. The pocket area is larger than the land pattern area of the component to prevent solder skipping and damage to the squeegee used in the printing process. These pockets are about 0.002 inches deep in the stencil and are etched through chemical processes from the metal stencil so that the thickness of the stencil for fine pitch components is less than for larger components. The pocket formed in the mesh about the fine pitch component is an additional 0.1 inches. The pocket is formed first and then the rest of the stencil apertures are formed in a normal fashion which could include either chemical etching or laser cutting. Multi-level etched stencils have the advantage of allowing varying thicknesses of solder paste to be applied in one application.

While etching of multi-level stainless steel stencils through chemical milling is known, chemical milling or etching of the polyimide material does not appear to be as easily attainable as chemical milling of stainless steel due to the manner in which the etching chemicals would attach the polyimide material. A discussion of chemical etching of polyimide film is discussed in "Accelerated Chemical Etching of Kapton® Polyimide Film" by J. A. Kreuz et all and presented at the IPC 25th Annual Meeting of April 1982. This paper briefly describes that high energy laser beams can be used to cut precise holes. It also teaches a demand for this cutting in polyimide films; however, there is no teaching on how to use a laser beam to mill polyimide film. Accordingly, there is a need for a cost effective, reliable method for milling pockets in polyimide stencils to provide the advantages of both polyimide stencil and multi-level stencils.

SUMMARY OF THE INVENTION

It is an object of the present invention to provide a method for cutting indentations into a polyimide sheet that utilizes a laser.

The present invention relates to a method for using a laser to cut an indentation of predetermined depth into a polyimide film. In particular it relates to a method of forming pockets in stencils made from a polyimide sheet used in the application of solder paste for surface mount electronic assemblies.

The method of the present invention controls the beam of the laser by directing the laser beam against the surface of the polyimide sheet. The laser beam has its power and pulse duration determined relative to each other and, additionally, relative to the pressure of a gas directed at the polyimide sheet where the laser beam cuts into the polyimide sheet. The gas provides the dual functions of 1) facilitating a clean burn into the polyimide material by vaporizing dross formed during laser burning and, by controlling the gas pressure relative to controlling the laser beam power and pulse duration, 2) determining the depth of the indentation cut into the polyimide sheet.

The polyimide stencil can be mounted on a work table that moves relative to the laser beam so that a groove or pattern is cut into the polyimide sheet.

In accordance with one aspect of the present invention there is provided a method of cutting an indentation of predetermined depth in a surface of a polyimide film using a laser comprising the steps of:

a) directing a laser beam from the laser against the surface of the polyimide film to cut into the polyimide film, the laser beam having a pulse duration and a power level;

b) directing a gas against the surface of the polyimide film where the laser beam cuts into the polyimide film, the gas having a pressure; and, c) determining the depth of the indentation cut into the surface of the polyimide material by selecting the pressure of the gas relative to selecting the pulse duration and the power level of the laser beam.

The polyimide film of the present invention has a thickness in the range of about 0.005 to 0.012 inches. The preferred polyimide films are KAPTON® and CIRLEX® (polyimides of DuPont). The polyimide materials suitable for use in the present invention should lend themselves to being cut by a low power laser.

It is envisaged that the depth of the indentation cut into the polyimide film is less than about 0.005 inches. The maximum depth that the laser may cut into the material in accordance with the teachings of the present invention will vary depending upon the values of laser beam pulse duration, laser beam power, and the pressure of the gas and type of gas used. Consequently, if the depth of the indentation cut into the polyimide film is too shallow, more than one pass or beam pulse at that location may be required to increase the depth of the indentation cut.

It should be clearly understood that the any one or more of the laser beam pulse duration, laser beam power, or gas pressure can be chosen such that a clean burn is obtained through the polyimide film. However, the present invention is not concerned with cutting cleanly through the polyimide stencil with a laser beam but with the ability of cutting pockets into the polyimide stencil so as to allow for a multi-level polyimide stencil to be manufactured entirely by laser processing. Typically, after the pockets have been formed in the polyimide stencil, the next step in the manufacture of the stencil is to cut out the land patterns by burning apertures through the polyimide stencil.

In the preferred embodiment of the present invention the gas used is air under pressures in the range of about 0.5 to 3.0 Bar. Alternatively, the gas used may be nitrogen or oxygen. The pulse duration of the laser beam lies in the range of about 1 to 50 micro-seconds. The laser beam current is chosen to be in the range of about 50 to 150 milli-amps where the laser beam current is a function of beam power. Each of these three variables is chosen relative to the other to control the depth of the indentation cut into the polyimide film.

It is envisaged that both YAG and $CO_2$ lasers can be employed to perform the indentation cutting of the present invention in the polyimide film. In the preferred embodiment a $CO_2$ laser is utilized because it is less expensive to use and the power requirements to cut into the polyimide film are low.

In accordance with another aspect of the present invention there is provided a method of using a laser to cut a groove of predetermined depth of less than about 0.005 inches in a stencil comprising a polyimide sheet having a thickness in the range of 0.005 to 0.012 inches. The method comprises the steps of:

a) mounting the stencil on a movable work table;

b) positioning and maintaining a laser a predefined distance from the polyimide sheet above the work table and directing a laser beam against the polyimide sheet to cut an indentation into the polyimide sheet, the laser beam having a pulse duration and a power level corresponding to an average power level according to a beam irradiated area;

c) directing a gas against the polyimide sheet where the laser beam cuts into the polyimide sheet, the gas having a pressure;

d) determining the depth of the indentation by choosing the pressure of the gas relative to choosing the pulse duration and the power level of the laser beam; and, e) moving the work table relative to the laser whereby the indentation cut into the polyimide sheet creates a groove as the laser beam moves across the polyimide sheet.

BRIEF DESCRIPTION OF THE DRAWINGS

A more complete understanding of the method and apparatus of the present invention may be obtained by reference to the following detailed description when taken in conjunction with the accompanying drawings wherein.

DETAILED DESCRIPTION OF EMBODIMENTS

Figure 1:
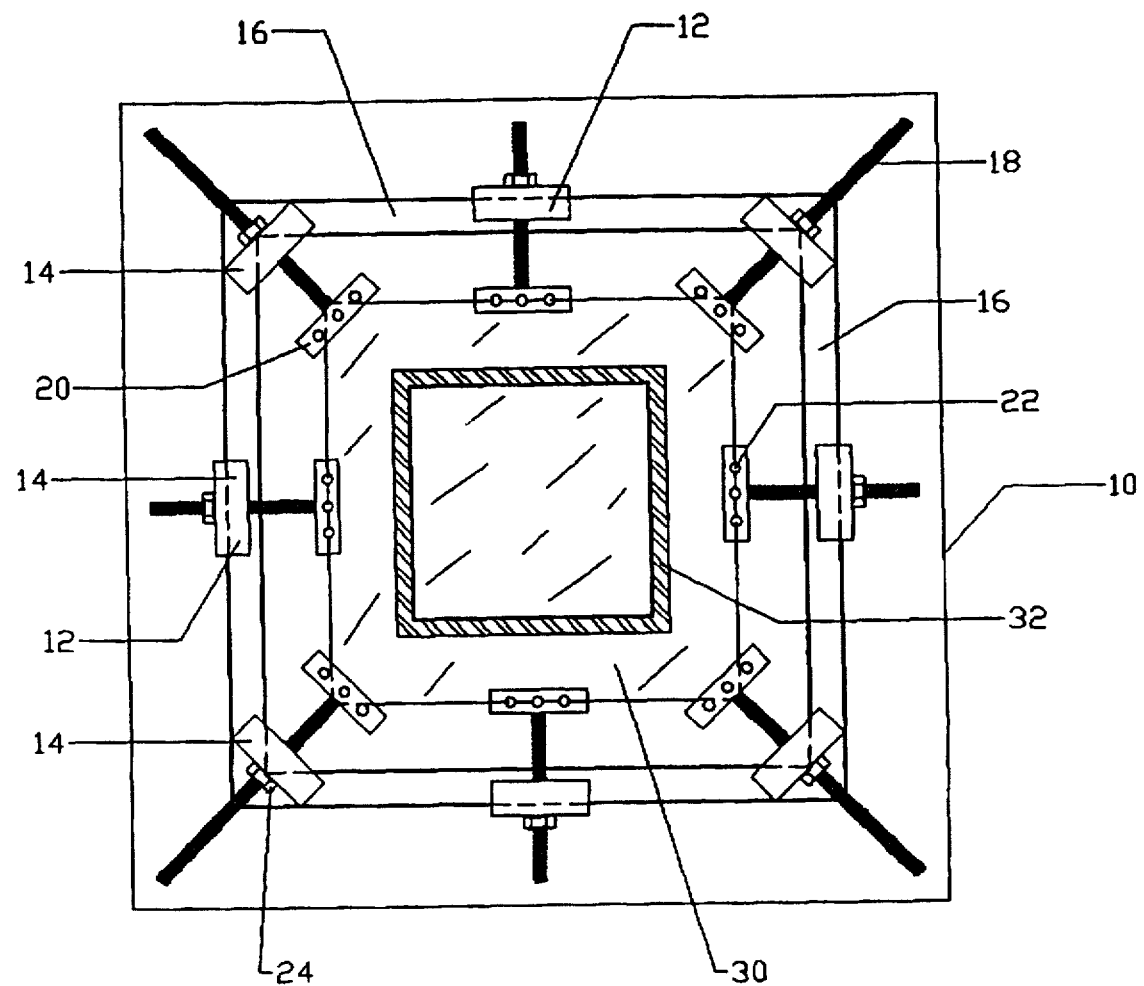
FIG. 1 shows a partial assembly of the stencil of the present invention.

Referring to the drawings the preferred embodiment of the present invention are described. Throughout the description of the preferred embodiment, reference will be made to cutting, or milling (cutting into), of the polyimide stencil material by the use of a $CO_2$ laser. It should be understood that a YAG laser may be used however because the stencil of the present invention lends itself to being readily cut by low powered lasers, it is more economical to use a $CO_2$ laser which cost is in the order of magnitude less expensive than a YAG laser. That is $100,000.00 for a YAG laser versus approximately $10,000.00 for a $CO_2$ laser.

Further, the preferred method of manufacturing the apertures in the multi-level polyimide stencil of the present invention is similar to the method described in the above-identified Canadian patent application of Keith Carroll, however, the method of the present invention differs in that method provides for pockets to be initially cut into the polyimide stencil prior to the apertures being cut into the stencil. It is the with the formation of pockets in the polyimide stencil to which the preferred embodiment of the present invention is directed.

Referring now to FIG. 1 there is shown a forming apparatus or table 10 used to pre-fabricate a stencil ready for cutting by laser. The table 10 includes a series of clamps 12. Any type of clamp may be utilized such as manual or automated clamps. The illustrated clamping arrangement 12 comprises a stationary member 14 secured to frame 16 of table 10. Passing through the stationary member 12 is an adjustable threaded stem 18 which is secured at one end to clamp 20. Clamp 20 comprises a pair of opposed plates which are drawn towards each other by screws or bolts 22. The clamp 12 is also provided with a nut 24 for securing the position of the plates 20 relative to the stationary member 12. For purposes of clarity only one of the clamping members 12 has been labelled in FIGS. 1 and 2 of the drawings.

Initially a piece of polyimide material is a cut as shown as 30 in the FIGS. The edges and the corners of the polyimide material are placed within clamps 12 at edge portions of the polyimide material. The clamps 12 are then adjusted through rotation of securing nut 24 and stem 18 to draw the polyimide material 30 tight. The polyimide material used in this process is that sold on the market by DuPont under the trade-marks KAPTON® and CIRLEX®. KAPTON is used for thicknesses below 0.007 inches and CIRLEX is used for thicknesses above 0.007 inches.

It should be understood that the polyimide material used in the present invention has very little memory associated with it and the stretching or the tightening procedure described with respect to FIG. 1 is done for the purposes of ensuring that the polyimide material is flat with no ripples in the material. The thickness of this material is typically in the order of 0.005 to 0.012 inches. It is a translucent material.

The next step is to place an aluminum frame 32 on the tightened sheet of polyimide material 30.

Figure 2:
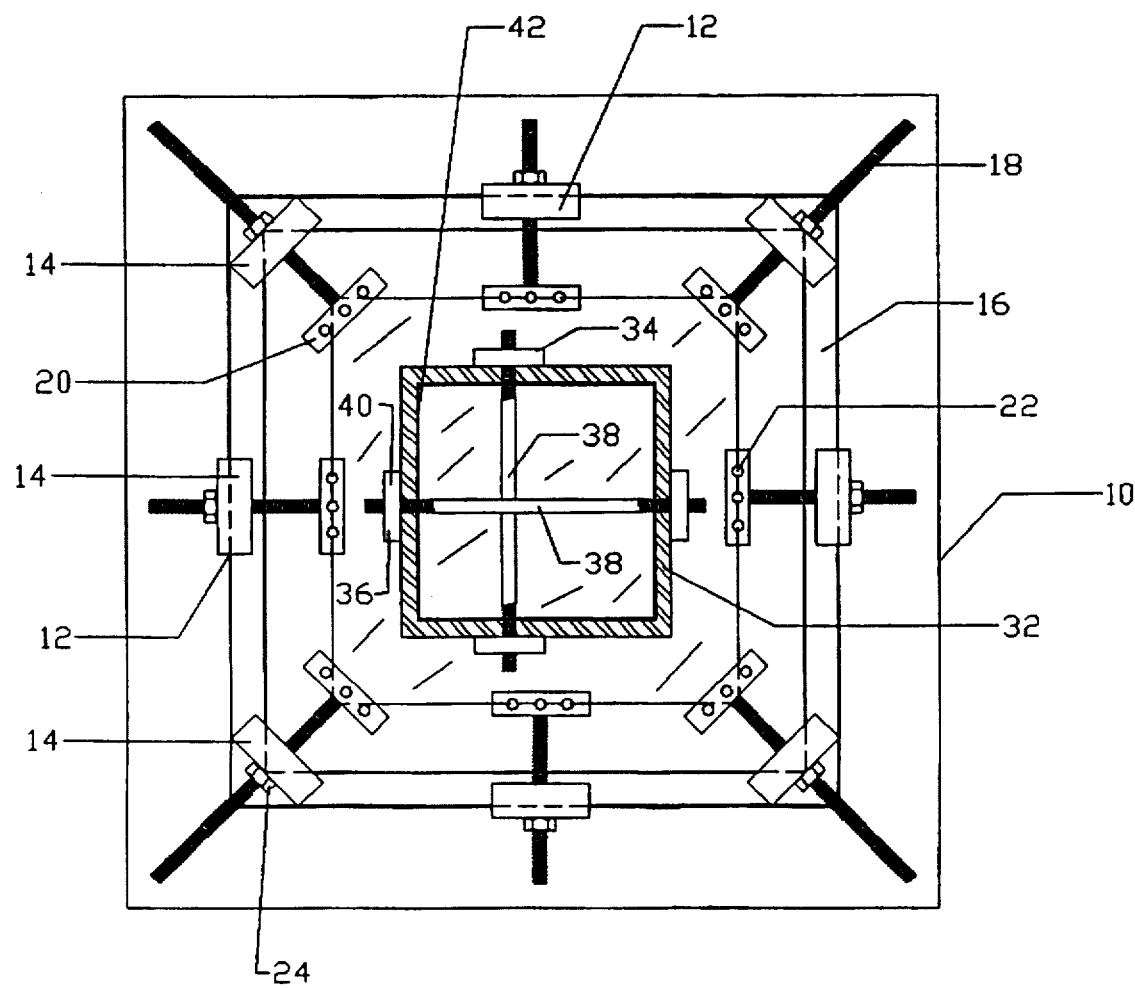
FIG. 2 shows a second view of a partial assembly of the stencil of the present invention.

Referring now to FIG. 2, the aluminum frame 32 has its opposing sides drawn in by clamp mechanisms 34 and 36. These mechanisms comprise two threaded rods 38 passing across and above the aluminum frame and being secured to blocks 40 by means of nuts (not shown). The rods are adjusted relative to the blocks 36 so as to compress the sides or draw in the sides of the aluminum frame relative to each other. Typically the sides of the frames may be drawn in as much as 0.080 inches.

The aluminum frame 32 is secured to the polyimide sheet by means of an epoxy resin which may be applied to the edges between the inside of the aluminum frame 32 and the polyimide film 30 as shown for a portion at 42. It should also be understood that the epoxy may be applied to the aluminum frame surfaces that come into contact with the polyimide film.

Typically the epoxy resin may take anywhere from a few hours to a few days to cure. During this curing time the table 10 maintains the relationship between the polyimide film and the aluminum frame.

After the adhesive has cured, the next step is to remove the clamps 34 and 36 and the clamps 12. This will cause the aluminum frame to return to its original shape and thereby ensure that the polyimide film 30 is secured tautly to the aluminum frame 32. It should be understood at this time that any excess materials for the polyimide film 30 extending beyond the frame 32 may be trimmed by a simple cutting knife.

Figure 3:
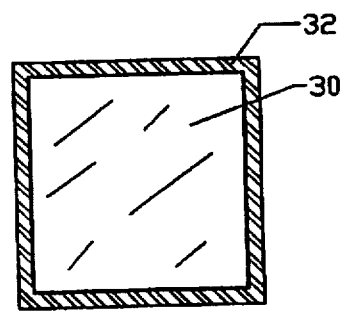
FIG. 3 shows the pre-fabricated stencil ready for cutting by laser.

At this stage in the process, a pre-fabricated stencil of polyimide film 30 surrounded by aluminum frame 32 is formed (FIG. 3). The size of the aluminum frames can be anywhere from 8 inches to 29 inches and can be made depending on the various types of boards that will require printing using the stencil. By pre-fabricating the stencils to that state shown in FIG. 3, the turn around time to complete an order is solely dependent on the cutting speed of the laser.

The next step in the processing of the multi-level stencil of the present invention is to use a laser to cut out a depressed pocket in the polyimide film. The co-ordinates and areas of the pocket patterns to be cut into the polyimide stencil are fed to computer 50 (FIG. 4) which controls the operation of $CO_2$ laser 52 and the positioning of computer numerically controlled (CNC) table 51 shown in FIG. 4 mounted relative to platform 56.

It should be understood that CNC tables are known in the industry and the schematic representation of the table should be all that is necessary to understand the method of making the stencil of the present invention. The $CO_2$ laser 52 is mounted upon a table or platform 56 and is provided with a helium tank 58, nitrogen tank 59 and $CO_2$ tank 60. The $CO_2$ laser 52 generates from its laser head 62 a focal beam 64 which cuts into but not through the polyimide film 30 of the stencil in this step. The computer 50 controls the laser beam pulse duration, laser beam power, laser pulsing rate, and gas pressure of gas emitted against the surface of the polyimide film where the laser cuts into the surface. The CNC table typically moves at a speed considerably slower than the pulse rate of the laser beam and hence the speed of movement of the CNC table relative to the pulse rate is not a significant factor in determining the depth of cut into the polyimide stencil. The distance 56 between the laser head 62 and the stencil polyimide film 30 is maintained constant by a mechanical and optical sensing system (not shown) working in conjunction with the computer 50. This maintains the beam power level at an average power level to the area of the polyimide sheet irradiated by the beam as the beam moves across the sheet.

In accordance with the teachings of the present invention, the depth of the indentation, groove, or pocket 63 cut into the polyimide stencil is determined by choosing the pressure of the gas relative to choosing the laser beam pulse duration and the laser beam power. The power is related to the laser beam current and the value of laser beam current can be controlled relative to beam pulse duration and gas pressure. It has be determined that by varying the gas pressure the cut into the polyimide film can be controlled. In particular, the depth of the indentation can be cut up to about 0.005 inches in a polyimide film having a thickness in the range of 0.005 to 0.012 inches. The depth of the cut can be controlled by choosing the values of laser beam pulse duration, laser beam power and gas pressure in accordance with the following relationship:

$$d_\delta := \left[ \frac{\frac{(\delta 1 - \delta)^2}{100 \cdot \pi} + \frac{(\delta - \delta 2)^3}{3^{\frac{1}{3}}} \left[\frac{50}{lt}\right]^2 + \left[\frac{k}{2}\right] + 55\frac{k}{lt}}{\frac{3}{lt} \cdot \frac{50}{lt}} \right] \cdot \left[\left|6 - \frac{500}{lt}\right|\right] \cdot c \cdot lt \cdot \sqrt{p}$$

where

"$d_\delta$" represents the depth of the indentation,

"lt" represents laser current, is proportional to laser power and is in the range of 50 to 150 milli-amps, "$\delta$" represents pulse duration of the laser beam and is in the range of 1 to 50 micro-seconds, "P" represents air gas pressure and is in the range of 0.5 to 3 Bars, "$\delta 1$" and "$\delta 2$" are constants associated with pulse duration and are respectively 40 and 30, "k" represents a constant associated with the laser being used and is $1.909 \times 10_3 \pi$, and "c" represents a constant associated with the polyimide material and is $6.67 \times 10^{-4}$.

It should be understood that the constants will change for differences in the characteristics of the polyimide films used and the type of lasers used.

Figure 6:
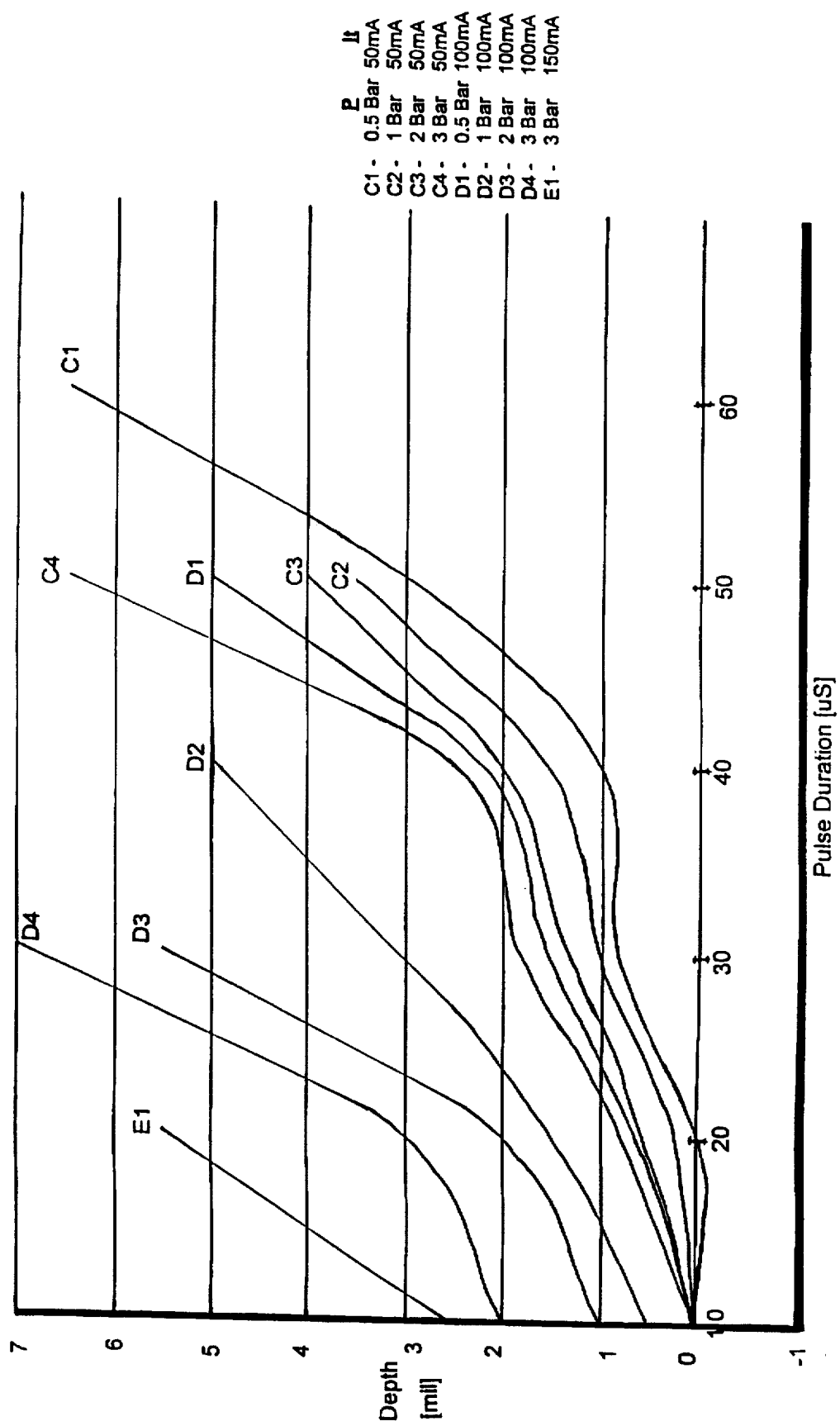
FIG. 6 is a graph of the relationship of the depth of the indentation cut into the polyimide film vs. changes in laser beam pulse duration for selected values of laser beam current power and gas pressure.

FIG. 6 illustrates graphs of the relationship of the depth of the indentation cut into the polyimide film vs. changes in laser beam pulse duration for selected values of laser beam current power and gas pressure. The values of the graphed curve C1 to C4, D1 to D4 and E1, the pulse duration can be adjusted to vary the depth of the cut. Further, the effect of varying gas pressure on depth of penetration can be seen in the relationships between curves C1 to C4 and D1 to D4. These curves show that as the gas pressure increases the curves move up. The effect on the changes of beam current (power) on the depth of the indentation cut is shown between curves C1-D1-E1, C2-D2, C3-D3, and C4-D4. The relationship between these curves shows that as the current/power increases the curves move to the left effecting pulse duration. Clearly the curves show the major effect that controlling the gas pressure of air has on controlling the cutting depth into the polyimide material.

Figure 4:
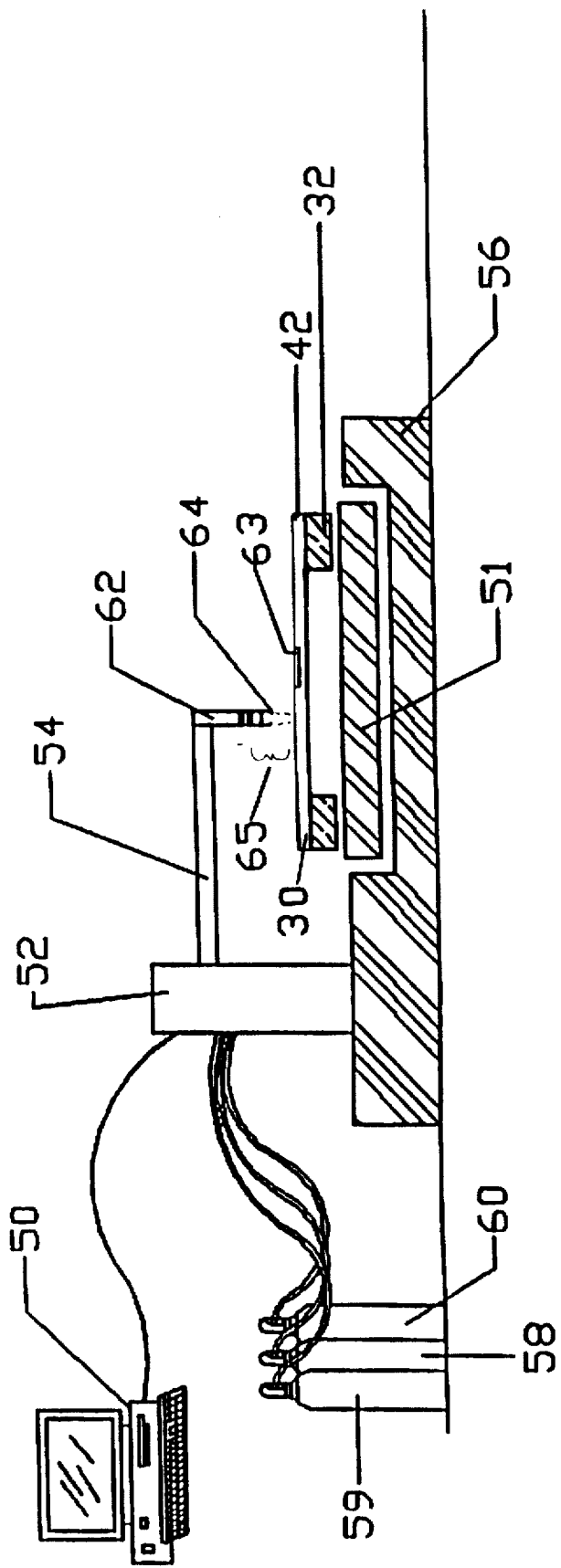
FIG. 4 illustrates the laser cutting pocketing step of the present invention.
Figure 5:
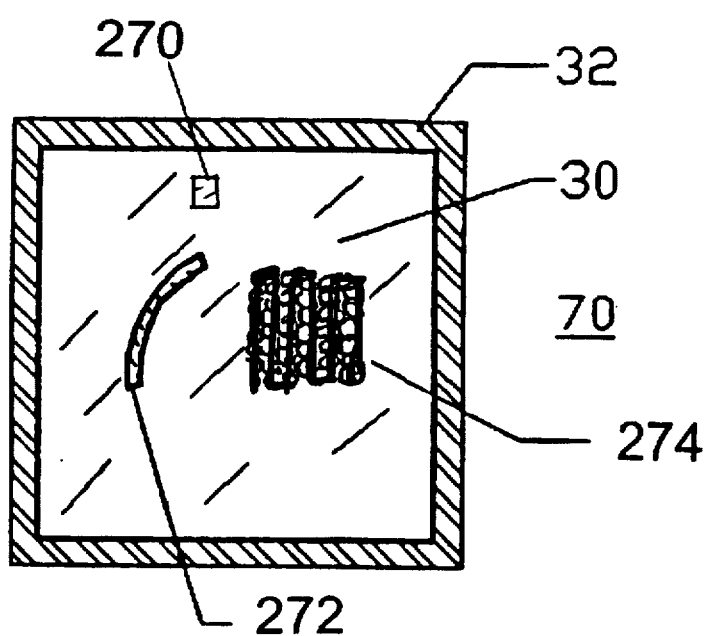
FIG. 5 represents a polyimide stencil as cut with a pocket by the laser cutting step of FIG. 4.

After the laser milling or indentation cutting step as shown in FIG. 4, the resultant stencil is shown in FIG. 5 and is labelled 70. For the purpose of illustration only, an indentation is shown at 270, a groove is shown at 272, a pattern of contiguous lines/grooves with the beam drawn over the lines at 274. The use of the polyimide stencil lends itself to cutting by low powered lasers such as $CO_2$ laser.

After the pockets have been cut into the polyimide stencil, the next step is to cut the land opening patterns through the stencil. The coordinates for the land openings pattern on the stencil are fed to computer 50 (FIG. 7) which controls the operation of $CO_2$ laser 52 and the positioning of computer numerically controlled (CNC) table 51 shown in FIG. 7 mounted relative to platform 56. The $CO_2$ laser 52 generates from its laser head 62 a focal beam or cutting beam 64 which cuts through the polyimide film 30 of the stencil. The apertures cut into the stencil are shown at 66. These apertures correspond to land patterns for surface mount technology used in the manufacture of printed circuit boards.

Figure 7:
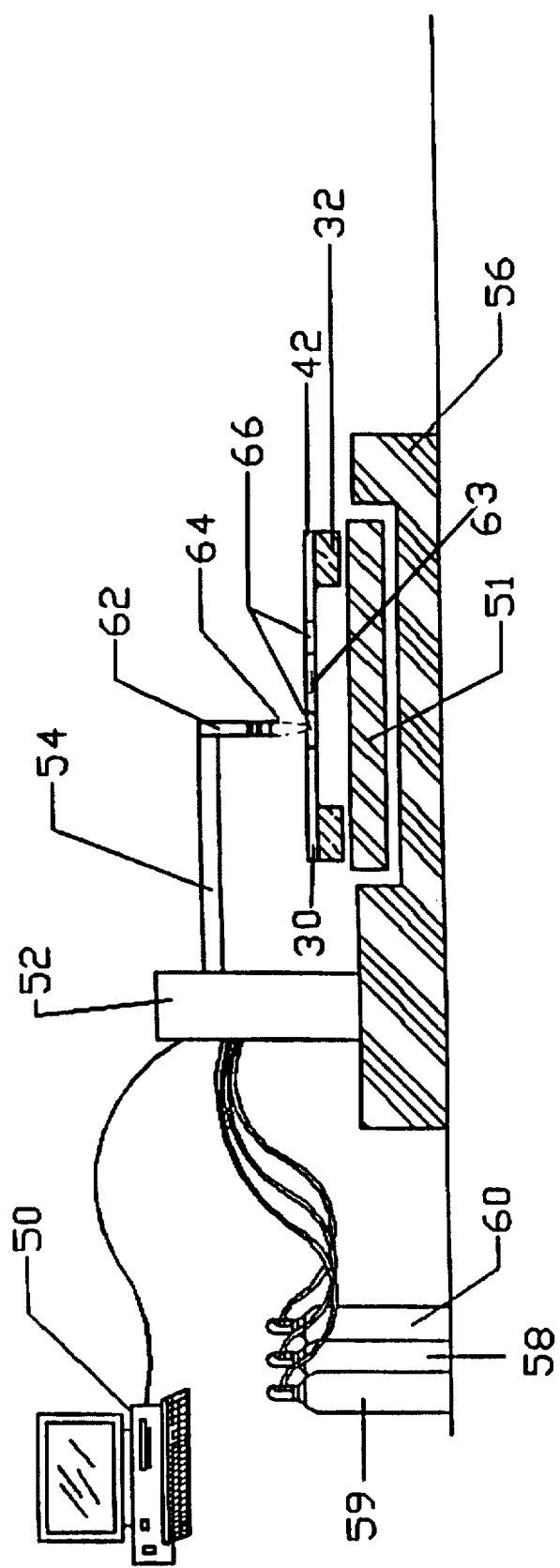
FIG. 7 illustrates the laser cutting step.
Figure 8:
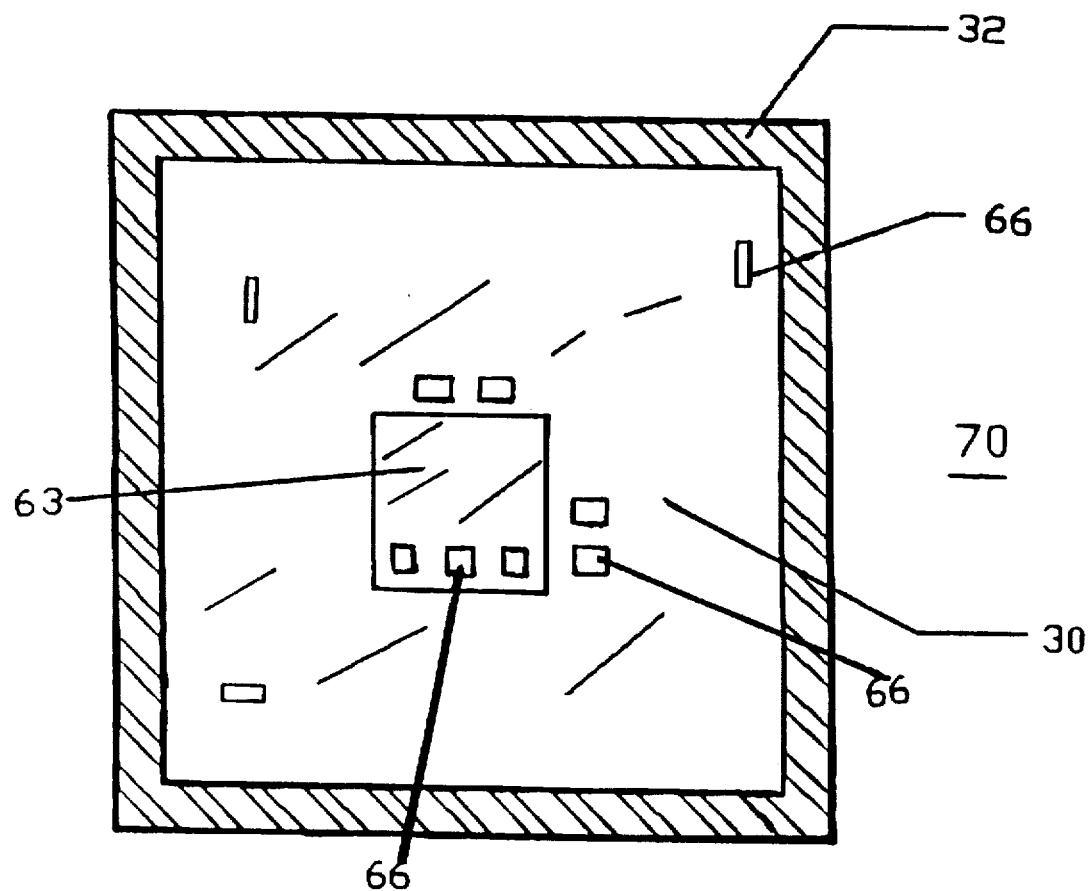
FIG. 8 represents a completed multi-level stencil as cut by the laser pocketing step of FIG. 4 and laser cutting step of FIG. 6; and, FIG. 9 illustrates the simplicity of the cleaning process associated with the manufacture of the stencil of FIG. 7 or 5.

After the laser cutting step shown in FIG. 7, the resultant stencil is shown in FIG. 8 and is labelled 70. The use of the polyimide stencil lends itself to cutting by low powered lasers such as $CO_2$ laser. The polyimide stencil is also to be cut relatively quickly compared to the cutting of stainless steel stencils. As a result, the process lends itself to prefabrication and follow up by laser cutting which means there can be a substantially quick turn around time associated with the manufacture of stencil 70 once an order is placed.

Figure 9:
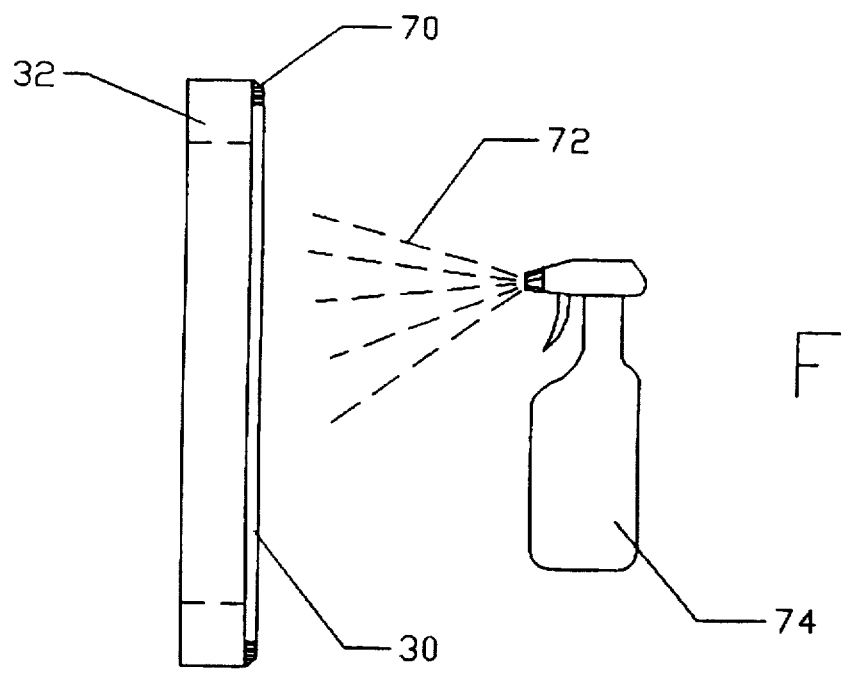

The next step in the process is to clean the dross from the stencil which has occurred from the cutting process. It should be understood that the polyimide material does not have much dross since the scum built up by the cut evaporates for the most part leaving a relatively clean burn. Any dross formation left is easily removed as shown in FIG. 9 by the application of a solution 72 to the stencil. The solution 72 simply comprises a water based solution including a mild detergent. Once the detergent is applied to the surface of the stencil it is rubbed off with the use of a hand cloth. The cleaning step of the polyimide stencil is very quick and easy to accomplish compared to the much harder step of electropolishing using acids for stainless steel stencils.

It should be understood that various alternative embodiments may be readily apparent to a man skilled in the art in view of the teachings as set out here and above.

What is claimed is:

1. A method of cutting an indentation of predetermined depth in a surface of a polyimide film using a laser comprising the steps of:
   a) directing a laser beam from said laser against the surface of the polyimide film to cut into said polyimide film, said laser beam having a pulse duration and a power level;
   b) directing a gas against the surface of said polymide film where the laser beam cuts into said polyimide film, said gas having a pressure; and,
   c) determining the depth of the indentation cut into the surface of the polyimide material by selecting the pressure of the gas relative to selecting the pulse duration and the power level of the laser beam.

2. The method of claim 1 wherein the polyimide film has a thickness in the range of 0.005 to 0.012 inches.

3. The method of claim 2 wherein the depth of the indentation is less than about 0.005 inches.

4. The method of claim 1 wherein the gas is air.

5. The method of claim 4 wherein the pressure of the gas is selected to be within the range of 0.5 to 3.0 Bar.

6. The method of claim 5 wherein the pulse duration is in the range of 1 to 50 micro-seconds.

7. The method of claim 6 wherein the power of the laser beam is a function of laser beam current and the laser beam current is chosen to be in the range of 50 to 150 milli-amps.

8. The method of claim 7 wherein the depth of the indentation is less than about 0.005 inches.

9. The method of claim 7 wherein the laser is a $CO_2$ laser.

10. The method of claim 1 wherein the step determining the depth of the indentation cut into the surface of the polyimide material involves selecting the pressure of the gas relative to selecting the pulse duration and the power level of the laser beam in accordance with the relationship of:

$$d_\delta := \left[ \frac{\frac{(\delta 1 - \delta)^2}{100 \cdot \pi} + \frac{(\delta - \delta 2)^3}{3^{\frac{1}{3}}} \left[\frac{50}{lt}\right]^2 + \left[\frac{k}{2}\right] + 55\frac{k}{lt}}{\frac{3 \cdot lt}{k\frac{50}{lt}}} \right] \cdot \left[\left|6 - \frac{500}{lt}\right|\right] \cdot c \cdot lt \cdot \sqrt{p}$$

where $d_\delta$ represents the depth of the indentation. It represents laser current and is proportional to laser power. $\delta$ represents pulse duration of the laser beam. P represents gas pressure. $\delta 1$ and $\delta 2$ are constants associated with pulse duration. k represents a constant associated with the laser being used, and c represents a constant associated with the polyimide material.

11. A method of using a laser to cut an indentation of a depth of less than about 0.005 inches in a polyimide film having a thickness in the range of 0.005 to 0.012 inches, comprising the steps of:

a) directing a laser beam from said laser against the surface of the polyimide film to cut into said polyimide film, said laser beam having a pulse duration and a power level;

b) directing a gas against the surface of said polymide film where the laser beam cuts into said polyimide film, said gas having a pressure; and, c) determining the depth of the indentation cut into the surface of the polyimide material involves selecting the pressure of the gas relative to selecting the pulse duration and the power level of the laser beam in accordance with the relationship of:

13. A method of using a laser to cut a groove of predetermined depth of less than about 0.005 inches in a stencil comprising a polyimide sheet having a thickness in the range of 0.005 to 0.012 inches, comprising the steps of:

a) mounting the stencil on a movable work table;

b) positioning and maintaining a laser a predefined distance from the polyimide sheet above the work table and directing a laser beam against the polyimide sheet to cut an indentation into said polyimide sheet, said laser beam having a pulse duration and a power level;

c) directing a gas against said polymide sheet where the laser beam cuts into said polyimide sheet, said gas having a pressure;

d) determining the depth of the indentation by choosing the pressure of the gas relative to choosing the pulse duration and the power level of the laser beam; and, e) moving said work table relative to said laser whereby the indentation cut into the polyimide sheet creates a groove as the laser beam moves across the polyimide sheet.

14. The method of claim 13 wherein the gas is air.

15. The method of claim 14 wherein the pressure of the gas is selected to be within the range of 0.5 to 3.0 Bar.

$$d_\delta := \left[ \frac{\frac{(\delta 1 - \delta)^2}{100 \cdot \pi} + \frac{(\delta - \delta 2)^3}{3^{\frac{1}{3}}} \left[\frac{50}{lt}\right]^2 + \left[\frac{k}{2}\right] + 55\frac{k}{lt}}{\frac{3 \cdot lt}{k\frac{50}{lt}}} \right] \cdot \left[\left|6 - \frac{500}{lt}\right|\right] \cdot c \cdot lt \cdot \sqrt{p}$$

where $d_\delta$ represents the depth of the indentation. It represents laser current, is proportional to laser power and is in the range of 50 to 150 milli-amps, $\delta$ represents pulse duration of the laser beam and is in the range of 1 to 50 micro-seconds. P represents air gas pressure and is in the range of 0.5 to 3 Bars. $\delta 1$ and $\delta 2$ are constants associated with pulse duration. k represents a constant associated with the laser being used, and c represents a constant associated with the polyimide material.

16. The method of claim 15 wherein the pulse duration is in the range of 1 to 50 micro-seconds.

17. The method of claim 16 wherein the power of the laser beam is a function of laser beam current and the laser beam current is chosen to be in the range of 50 to 150 milli-amps.

18. The method of claim 16 wherein the laser is a $CO_2$ laser.

19. The method of claim 13 wherein the step determining the depth of the indentation cut into the surface of the polyimide material involves selecting the pressure of the gas relative to selecting the pulse duration and the power level of the laser beam in accordance with the relationship of:

$$d_\delta := \left[ \frac{\frac{(\delta 1 - \delta)^2}{100 \cdot \pi} + \frac{(\delta - \delta 2)^3}{3^{\frac{1}{3}}} \left[\frac{50}{lt}\right]^2 + \left[\frac{k}{2}\right] + 55\frac{k}{lt}}{\frac{3 \cdot lt}{k\frac{50}{lt}}} \right] \cdot \left[\left|6 - \frac{500}{lt}\right|\right] \cdot c \cdot lt \cdot \sqrt{p}$$

12. The method of claim 11 further including the step of positioning and maintaining said laser a predefined distance from the polyimide sheet.

where $d_\delta$ represents the depth of the indentation. It represents laser current and is proportional to laser power. $\delta$ represents pulse duration of the laser beam. P represents gas pressure, δ1 and δ2 are constants associated with pulse duration, k represents a constant associated with the laser being used, and c represents a constant associated with the polyimide material.

20. The method of claim 19 wherein the gas is air.

21. The method of claim 16 wherein the laser is a $CO_2$ laser.

22. The method of claim 19 further including the step of pulsing the laser at a rate in excess of relative movement between said work table and said laser such that the cut is not effected by speed of table movement.

23. The method of claim 19 further including the step of changing direction of table movement to allow a continuous groove having a pattern of adjacent contiguous grooves that result in a pocket being cut into the polyimide sheet.

24. The method of claim 13 further including the step of pulsing the laser at a rate in excess of relative movement between said work table and said laser such that the cut is not effected by speed of table movement.

25. The method of claim 13 further including the step of changing direction of table movement to allow a continuous groove having a pattern of adjacent contiguous grooves that result in a pocket being cut into the polyimide sheet.

26. The method of claim 13 further including the step of moving the work table over the same path to increase the depth of the indentation.

27. The method of claim 25 further including the step of moving the work table over the same path to increase the depth of the indentation.

28. The method of claim 25 further including the step of cutting apertures in the polyimide sheet subsequent to pocket formation.

* * * * *